(12) United States Patent
Vanbesien

(10) Patent No.: US 6,899,551 B1
(45) Date of Patent: May 31, 2005

(54) COMPONENT FOR ASSEMBLY ON A PRINTED CIRCUIT BOARD

(75) Inventor: Johan Vanbesien, Ypres (BE)

(73) Assignee: Tyco Electronics Logistics AG, Steinach (CH)

( * ) Notice: Subject to any disclaimer, the term of this patent is extended or adjusted under 35 U.S.C. 154(b) by 0 days.

(21) Appl. No.: 10/049,947

(22) PCT Filed: Aug. 21, 2000

(86) PCT No.: PCT/IB00/01377

§ 371 (c)(1),
(2), (4) Date: Jul. 23, 2002

(87) PCT Pub. No.: WO01/15503

PCT Pub. Date: Mar. 1, 2001

(30) Foreign Application Priority Data

Aug. 20, 1999 (DE) ................. 199 39 584

(51) Int. Cl.[7] .......................................... H01R 12/00
(52) U.S. Cl. ....................................... 439/79; 439/686
(58) Field of Search ........................ 439/79, 686, 874, 439/876, 259, 701, 594, 717, 885, 660

(56) References Cited

U.S. PATENT DOCUMENTS

| | | | |
|---|---|---|---|
| 4,612,602 A | * | 9/1986 | Weyer et al. ............... 361/730 |
| 4,840,568 A | * | 6/1989 | Burroughs et al. ........... 439/49 |
| 4,986,772 A | | 1/1991 | Fukutani |
| 5,066,236 A | | 11/1991 | Broeksteeg |
| 5,104,341 A | | 4/1992 | Gilissen et al. |
| 5,104,827 A | | 4/1992 | Schneider et al. |
| 5,236,375 A | | 8/1993 | Kachlic |
| 5,286,212 A | | 2/1994 | Broeksteeg |
| 5,342,211 A | | 8/1994 | Broeksteeg |
| 5,931,687 A | | 8/1999 | McFarlane et al. |
| 5,961,355 A | | 10/1999 | Morlion et al. |
| 6,171,149 B1 | * | 1/2001 | van Zanten ................. 439/608 |
| 6,179,663 B1 | * | 1/2001 | Bradley et al. ............. 439/608 |
| 6,183,301 B1 | | 2/2001 | Paagman |
| 6,511,353 B2 | * | 1/2003 | Champion et al. .......... 439/891 |

FOREIGN PATENT DOCUMENTS

| | | |
|---|---|---|
| DE | 197 548 77 | 7/1999 |
| EP | 0 784 359 B1 | 7/1997 |
| EP | 0 854 549 A2 | 7/1998 |
| EP | 0 924 812 A1 | 6/1999 |

* cited by examiner

*Primary Examiner*—Gary Paumen
*Assistant Examiner*—Edwin A. Leon
(74) *Attorney, Agent, or Firm*—Baker & Daniels

(57) ABSTRACT

Described is a component for mounting on a circuit board, comprising a multiplicity of electrical terminal members for connection to said circuit board. The component is characterized in that several electrical terminal members are fixed in a predetermined relative position by a plastics body that is injection-molded thereto. The electrical terminal members can thus be permanently and reliably fixed in an exact, predetermined relative position with minimum expenditure.

20 Claims, 3 Drawing Sheets

COMPONENT FOR ASSEMBLY ON A PRINTED CIRCUIT BOARD

BACKGROUND OF THE INVENTION

1. Field of the Invention

The present invention relates to a device according to the generic clause of claim 1, i.e. to a component for mounting on a printed circuit board, comprising a multiplicity of electrical terminal members for connection to the circuit board.

2. Description of Related Art

Such a component is, for example, the electrical connector shown in FIG. 5. The electrical connector shown consists in essence of contact elements, not shown in FIG. 5, for connecting the electrical connector to another electrical connector, a housing 1 enclosing the contact elements, electrical terminal members 2 extending out of housing 1 for soldering the electrical connector to a printed circuit board LP, and an alignment plate 3.

By means of the alignment plate 3, the electrical terminal members 2 of the electrical connector are held in a predetermined relative position. As regards further details of alignment plate 3, reference is made to document DE 197 54 877 A1.

Holding of the electrical terminal members in a predetermined relative position is of advantage in particular when the electrical connector is a component for surface mounting, i.e. when the electrical terminal members are so-called SMT contacts.

SMT contacts are designed to be soldered to surface contacts of the printed circuit board. In this regard, soldering paste is applied first to the surface contacts of the circuit board, thereafter the component to be soldered to the circuit board is arranged on the circuit board, and finally the soldering operation proper takes place by heating the locations concerned.

For performing proper soldering, the locations of the electrical terminal members of the electrical connector to be soldered to the surface contacts of the circuit board must be in contact with the soldering paste during heating; otherwise, a solder connection obviously cannot be established between the surface contacts of the circuit board and the electrical terminal members of the electrical connector.

For this reason, the locations to be soldered of the electrical terminal members of a component have to be located approximately in one plane. Possibly existing deviations from a coplanar arrangement of these locations are tolerable to a very limited extent only.

This is a serious problem in particular with components having a very large number of electrical terminal members.

For eliminating this problem, the electrical terminal members of surface-mountable components are not seldom fixed in their proper relative position by the aforementioned alignment plate 3. The effect achievable thereby is that the locations to be soldered of all electrical terminal members are located in one plane.

That the electrical terminal members of a component assume an exactly prescribed relative position may also be necessary for components that are not designed for surface mounting. In this case, too, the use of an alignment plate or the like may turn out to be advantageous.

However, the manufacture and in particular the mounting of such alignment plates involve a not inconsiderable expenditure

OBJECT OF THE INVENTION

It is thus the object of the present invention to develop the component according to the generic clause of claim 1 in such a manner that the electrical terminal members thereof can be reliably and permanently fixed in an exact, predetermined relative position with minimum expenditure.

BRIEF SUMMARY OF THE INVENTION

According to the invention, this object is met by the feature claimed in the characterizing part of claim 1.

According to the latter, it is provided that a plurality of electrical terminal members is fixed in a predetermined relative position by a plastics body that is injection-molded to said terminal members.

Fixing of the terminal members in a predetermined relative position by injection-molding of a plastics body to the previously aligned terminal members can be effected in considerably simpler manner than the manufacture and mounting of an alignment plate or the like. Furthermore, terminal members fixed by a molded-on plastics body are fixed in considerably exacter and safer manner than in case of utilization of alignment plates or the like.

With a component designed as claimed, the electrical terminal members can be reliably and permanently fixed in an exact, predetermined relative position with minimum expenditure.

Advantageous developments of the invention are set forth in the dependent claims, the following description and the figures.

BRIEF DESCRIPTION OF THE DRAWINGS

The invention will be elucidated hereinafter in more detail with reference to the drawings wherein.

DETAILED DESCRIPTION OF THE INVENTION

The component with respect to which the invention will be described in more detail hereinafter is an electrical connector. However, it is to be pointed out already here that the special features of the electrical connector described in more detail hereinafter can be applied to other components as well.

The electrical connector illustrated in more detail herein comprises a multiplicity of electrical terminal members to be soldered to the printed circuit board. The special features of the electrical connector described in more detail hereinafter, however, may also be employed with other components connected to the circuit board other than by soldering.

The electrical terminal members to be soldered to the circuit board, in the embodiment illustrated, are SMT contacts designed for surface-mounting of the component on the circuit board. However, the electrical terminal members to be soldered to the circuit board may also be terminal members designed for soldering (reflow soldering, wave soldering etc.) in plated-through holes of the circuit board.

It would be conceivable just as well that the electrical terminal members of the components to be soldered to the circuit board are terminal members designed for soldering thereof on the opposite side of the circuit board.

It is to be pointed out already here that the provision of the special features described hereinafter has very advantageous effects with components in which the electrical terminal members are constituted by SMT contacts; however, positive effects can be achieved also with components the electrical terminal members of which are designed for soldering in accordance with a different method.

Figure 5:
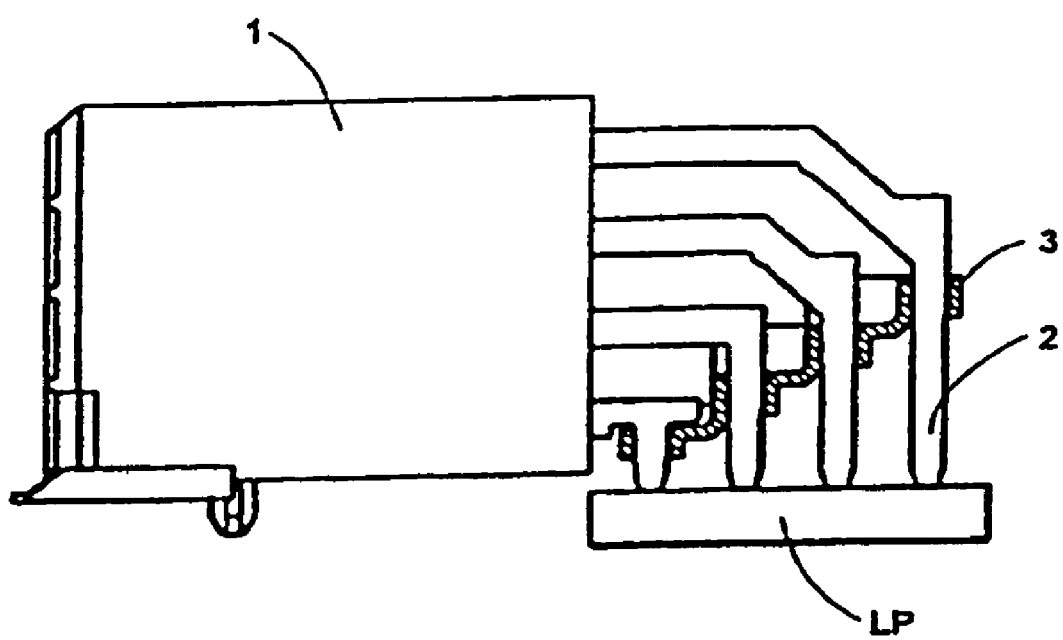
FIG. 5 shows a conventional electrical connector

The electrical connector illustrated in more detail here in so far corresponds to the electrical connector described initially with reference to FIG. 5.

The connector illustrated in more detail here distinguishes itself in particular in that a plurality of electrical terminal members are fixed in a predetermined relative position by a plastics body that is injection-molded thereto.

This will be described in more detail hereinafter with reference to FIGS. 1 to 4.

The already mentioned electrical terminal members of the electrical connector concerned bear the reference numeral 12. In the embodiment illustrated, there is provided a total of 25 electrical terminal members. These are designed and arranged such that they can be-soldered to a surface contact matrix comprising 5 rows and 5 columns.

It should be obvious that both the number and the arrangement of the electrical terminal members and of the associated surface contacts may be different in arbitrary manner.

In addition thereto, the electrical connector contains a housing 11 which, however, in contrast to the housing 1 of the electrical connector according to FIG. 5 does not only accommodate the contact elements necessary for establishing contact with another electrical connector, but also the majority of the electrical terminal members that are exposed in the electrical connector according to FIG. 5; as regards the electrical terminal members 12, it is in essence just the locations provided for soldering to the circuit board that project from the housing.

Figure 2:
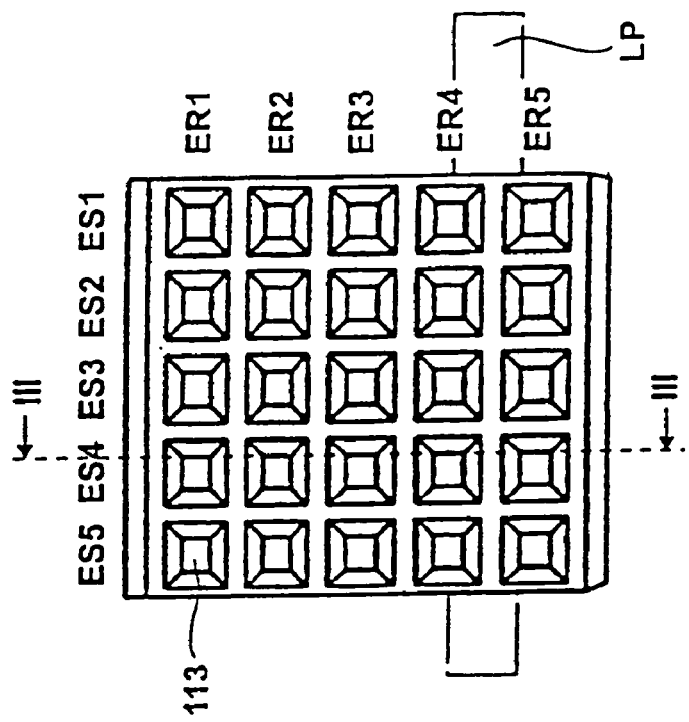
FIG. 2 shows a front view of the electrical connector shown in FIG. 1.
Figure 1:
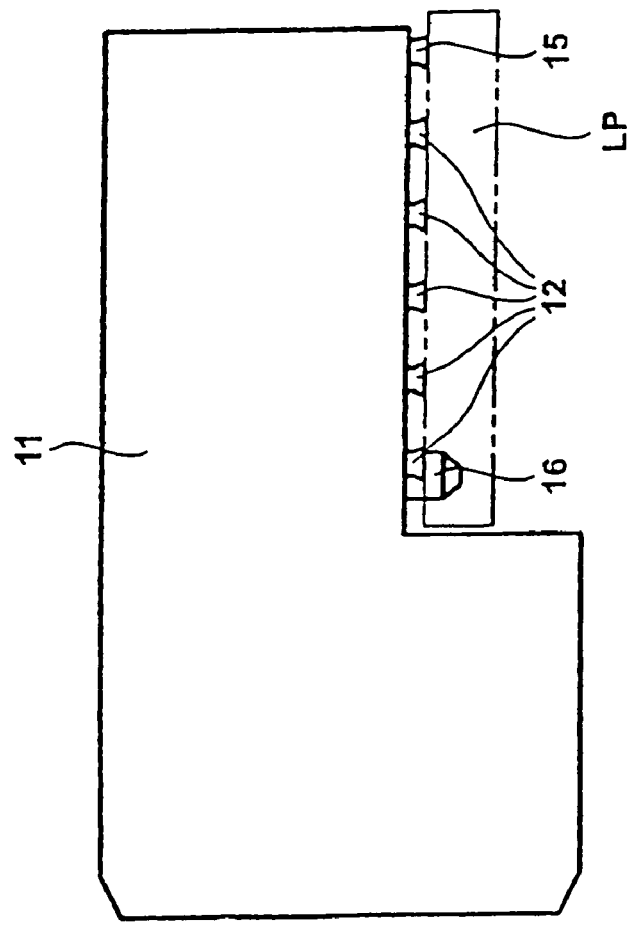
FIG. 1 shows a side view of an electrical connector described in more detail hereinafter.
Figure 3:
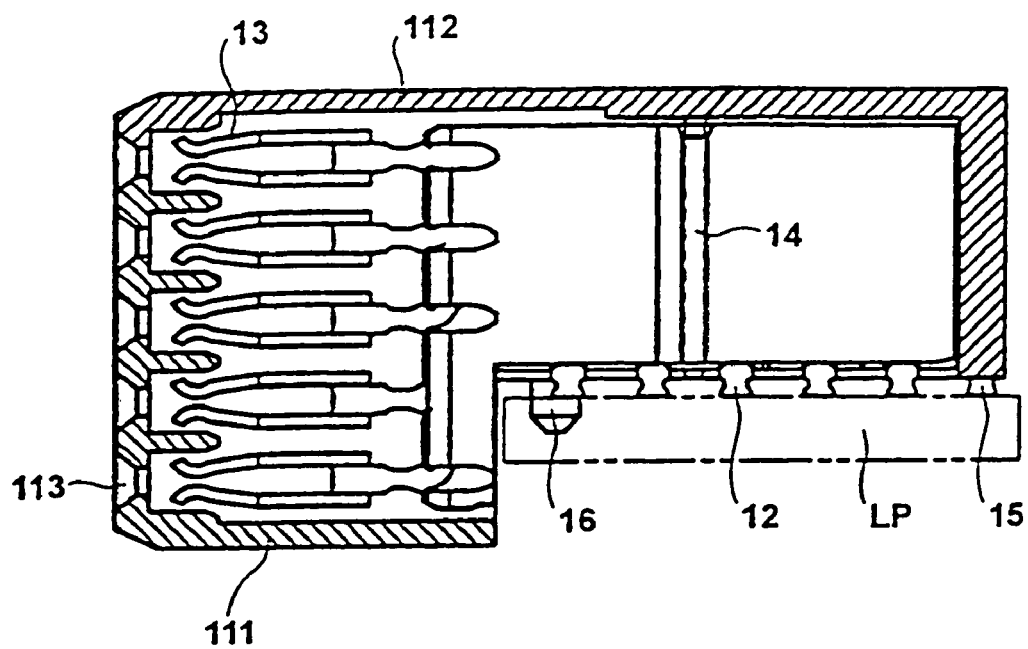
FIG. 3 shows a sectional side view of the electrical connector shown in the preceding figures (section along the line III—III in FIG. 2)
Figure 4:
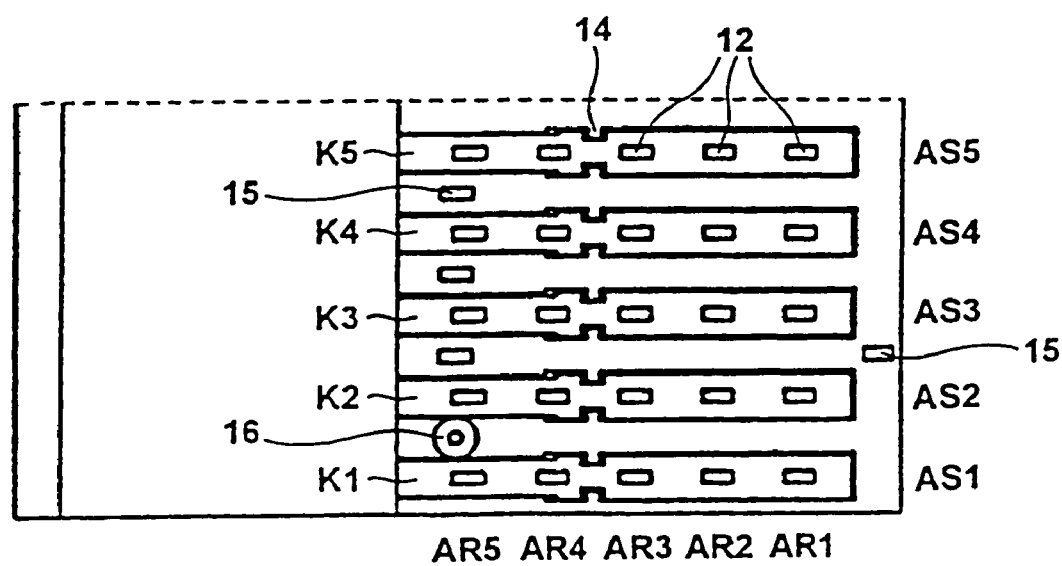
FIG. 4 shows a bottom view of the electrical connector shown in the preceding figures.

As can be seen in particular from FIG. 3, the housing 11 in the embodiment illustrated consists of two parts, namely a bottom part 111 and a top part 112.

The bottom part 111 and/or the top part 112 of housing 11 or other constituent parts of the electrical connector may be mechanically connected to printed circuit board LP at one or more anchoring points 15. At these anchoring points, the housing parts, for example, can be soldered to the circuit board, with this soldering in case of surface-mounted components, such as the electrical connector illustrated, preferably taking place in accordance with an SMT process as well. Such or other anchoring of the electrical connector on the circuit board provides the same with a firm hold; moreover, in case of mechanical loads, it cannot be detached from the circuit board as easily as without such anchoring. The anchoring elements may also facilitate that the electrical connector assumes its proper position when the same is mounted on the circuit board.

For exact positioning of the electrical connector on the printed circuit board, the embodiment illustrated moreover provides for one or more positioning pins 16 to be inserted into associated openings in the circuit board.

FIG. 3 also illustrates the contact elements of the electrical connector provided for connecting the same to another electrical connector; these are designated 13 in FIG. 3. The contact elements 13 are arranged behind insertion openings 113 provided in housing 11; through these insertion openings, the contact elements of the electrical connector to be contacted with the illustrated electrical connector, may be contacted with contact elements 13. As can be seen in particular from FIG. 2, a total of 25 insertion openings 113 is provided in the embodiment illustrated; these are arranged in a matrix of 5 rows and 5 columns. The insertion opening rows extend in horizontal direction and are constituted by insertion openings arranged laterally beside each other; these are designated ER1 to ER5 in the figures. The insertion opening columns extend in vertical direction and are constituted by insertion openings arranged one above the other; these are designated ES1 to ES5 in the figures.

The contact elements 13 arranged behind the insertion openings 113 are connected to the electrical terminal members 12 or merge with the same. The electrical terminal members, or to be more precise, the locations thereof to be soldered to the circuit board are arranged in a matrix of 5 rows and 5 columns as well. This can be seen in particular from FIG. 4. The terminal member rows are designated AR1 to AR5, and the terminal member columns are designated AS1 to AS5. In this regard, the contact elements and terminal members provided at mutually corresponding locations within the matrices are connected to each other. I.e., a contact element provided behind the $m^{th}$ insertion opening column and the nth insertion opening row is connected to the terminal member provided in the $m^{th}$ terminal member column and the nth terminal member row.

As was already pointed out hereinbefore, provisions have to be taken with SMT components, such as the electrical connector illustrated, that the locations of the electrical terminal members to be soldered to the circuit board are coplanar.

In the embodiment illustrated, this is achieved in that the electrical terminal members brought into a corresponding relative position have plastics material injection-molded therearound. Due to this, a common plastics body is formed around the terminal members, through which the terminal members extending through the same are fixed in their relative position taken at the time of the injection molding operation. For the sake of completeness, it is to be pointed out that the locations of the terminal members to be soldered to the circuit board, of course, are not subject to injection-molding; the plastics body injection-molded around the terminal members is arranged and dimensioned such that it does not interfere with the mounting of the electrical component on the circuit board.

Depending on the particular requirements, either all or only specific terminal members may have material injection-molded therearound as described. The terminal members to be subjected to such injection molding may be fixed by a plastics body common to all terminal members or by several individual plastics bodies.

In the embodiment illustrated, the latter possibility is employed. In doing so, the terminal members are subjected to such injection molding in the forms of columns each. This turns out to be particularly advantageous since the terminal members of a terminal member column may be manufactured in common as well: the terminal members arranged in a column each (preferably together with the associated contact elements) may be commonly stamped and formed from one single sheet metal member. The injection molding operation of the commonly manufactured (in the same sequence of operations) turns out to be particularly simple since these may thus be processed further directly after their manufacture.

The terminal members of the electrical connector illustrated are thus fixed in columns by plastics bodies of their own each. These plastics bodies are lamella-like structures designated K1 to K5 in the figures.

Due to the fact that at all times "only" those terminal members are connected via a common plastics body that are manufactured in the same sequence of operations each, and due to the fact that injection molding of plastics material around the terminal members may take place immediately after manufacture thereof, the terminal members can be fixed in their relative position in which they were stamped out. If the terminal members are stamped out such that they take the desired relative position after stamping, the terminal members can be fixed in the desired relative position by the subsequent molding of plastics material therearound, without a preceding adjustment.

If the terminal members, as in the embodiment illustrated, are fixed in their desired relative positions independently of each other by several separate plastics bodies, it turns out to be expedient if the plastics bodies, preferably at a central location thereof, are provided with structures by means of which the several plastics bodies and thus all terminal members of the electrical connector may be brought into a predetermined relative position.

In the embodiment illustrated, the structures mentioned are formed by vertically extending grooves 14 in plastics bodies K1 to K5. The grooves may receive, by arrangement of the top part 112 of housing 11 thereon, elements provided on the latter, such as e.g. vertically extending intermediate walls, webs, pegs, pins and the like. The plastics bodies thus can be aligned in lateral direction relative to each other.

In particular with very large electrical connectors (having many columns) or other components, it may turn out expedient if the alignment of the plastics bodies as described or in a different manner does not restrict the movability thereof in the direction perpendicular to the circuit board surface. The plastics bodies along with the terminal members extending through the same may then— driven by their own weight—move downwardly to different extents independently of each other and may thus compensate irregularities present in the circuit board.

With a component that is designed as described, it is possible irrespective of the details of the practical realization to reliably and permanently fix the electrical terminal members in an exact, predetermined relative position with minimum expenditure.

What is claimed is:

1. An electrical connector for mounting on a printed circuit board, comprising a multiplicity of electrical terminal members to be connected to said circuit board and being in the form of a matrix including a plurality of rows and columns each, wherein several terminal member groups, each comprising several terminal members in the form of SMT contacts to be soldered to the circuit board, are fixed in a predetermined relative position independently of each other by plastic bodies of their own that are injection-molded thereto, several plastic bodies along with the terminal member groups extending through the same are adapted to be fixed in predetermined relative positions, and the plastic bodies fixed in a predetermined relative position, along with the terminal member groups extending through the same, are movable perpendicularly to the circuit board surface independently of each other.

2. A connector according to claim 1, wherein the plastics body along with the terminal members extending through the same is movable relative to specific or all remaining constituent parts of the connector.

3. A connector according to claim 1, wherein the terminal members of the terminal member groups each are such terminal members that are manufactured in common.

4. A connector according to claim 1, wherein the terminal members of the terminal member groups each are such terminal members that can be connected to the circuit board at mutually adjacent locations.

5. A connector according to claim 1, wherein the terminal members extending through the respective plastics bodies are the sole constituent parts each of the connector to which the plastics bodies are connected.

6. A connector according to claim 1, wherein the several plastics bodies along with the terminal member groups extending through the same are movable relative to each other.

7. A connector according to claim 6, wherein the plastic bodies include alignment members molded within the plastic body.

8. A connector according to claim 7, wherein the connector includes an outer housing having a plurality of spaced apart walls arranged in columns, said plastic bodies and said spaced apart walls having cooperating alignment members.

9. A connector according to claim 8, wherein said alignment members comprise cooperating grooves and ribs.

10. A connector according to claim 9, wherein said cooperating grooves and ribs are vertically extending.

11. A connector according to claim 7, wherein the terminal members extending through the respective plastic bodies are the sole constituent parts each of the connector to which the plastics bodies are connected.

12. A connector according to claim 11, wherein the connector includes an outer housing having a plurality of spaced apart walls arranged in columns, said plastic bodies and said spaced apart walls having cooperating alignment members.

13. A connector according to claim 11, wherein said alignment members comprise cooperating grooves and ribs.

14. A connector according to claim 13, wherein said cooperating grooves and ribs are vertically extending.

15. An electrical connector for mounting on a printed circuit board, comprising a plurality of electrical terminal members profiled for connection to the circuit board and being in the form of a matrix including a plurality of rows and columns, wherein several terminal member groups, each comprising several terminal members in the form of contacts to be soldered to the circuit board, are fixed in a predetermined relative position independently of each other by molded plastic bodies, several molded plastic bodies along with the terminal member groups extending through the same are adapted to be fixed in predetermined relative positions, and the molded plastic bodies, along with the terminal member groups extending through the same, are movable perpendicularly to the circuit board surface independently of each other.

16. A connector according to claim 7, wherein the plastic body along with the terminal members extending through the same is movable relative to specific or all remaining constituent parts of the connector.

17. A connector according to claim 7, wherein the terminal members of the terminal member groups each are such terminal members that are manufactured in common.

18. A connector according to claim 7, wherein the several plastics bodies along with the terminal member groups extending through the same are movable relative to each other.

19. A connector according to claim 7, wherein the terminal members of the terminal member groups each are such terminal members that can be connected to the circuit board at mutually adjacent locations.

20. A connector according to claim 19, wherein the plastic bodies include alignment members molded within the plastic body.

* * * * *